(12) United States Patent
Appel et al.

(10) Patent No.: US 12,095,421 B2
(45) Date of Patent: Sep. 17, 2024

(54) TUNABLE DRIVER

(71) Applicant: Cisco Technology, Inc., San Jose, CA (US)

(72) Inventors: Craig S. Appel, Macungie, PA (US); Peter C. Metz, Macungie, PA (US); Joseph V. Pampanin, Hellertown, PA (US); Sanjay Sunder, Allentown, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 17/810,792

(22) Filed: Jul. 5, 2022

(65) Prior Publication Data
US 2022/0337194 A1  Oct. 20, 2022

Related U.S. Application Data

(62) Division of application No. 16/417,295, filed on May 20, 2019, now Pat. No. 11,411,538.

(51) Int. Cl.
*H03F 1/02* (2006.01)
*H03F 3/45* (2006.01)
*H03K 5/24* (2006.01)

(52) U.S. Cl.
CPC ....... *H03F 1/0211* (2013.01); *H03F 3/45179* (2013.01); *H03F 3/45663* (2013.01); *H03K 5/2481* (2013.01)

(58) Field of Classification Search
CPC ............... H03F 1/0211; H03F 3/45179; H03F 3/45663; H03K 19/00369; H03K 19/017509; H03K 5/2481
See application file for complete search history.

(56) References Cited

U.S. PATENT DOCUMENTS

| | | | |
|---|---|---|---|
| 2007/0058988 A1 | 3/2007 | Yonenaga | |
| 2007/0257735 A1 | 11/2007 | Chan et al. | |
| 2017/0317684 A1* | 11/2017 | Chakrabarti | H03G 3/001 |
| 2019/0131945 A1* | 5/2019 | Lakshmikumar | G05F 1/46 |

* cited by examiner

*Primary Examiner* — Brandi N Thomas
(74) *Attorney, Agent, or Firm* — Patterson + Sheridan, LLP

(57) ABSTRACT

Embodiments provide for a tunable driving circuit by monitoring a frequency of a ring oscillator of an electrical integrated circuit connected to an optical modulator to determine operational characteristics of the electrical integrated circuit; setting, based on the operational characteristics, a driving voltage for a plurality of tunable inverters and a plurality of fixed gain inverters that control the optical modulator, wherein each tunable inverter of the plurality of tunable inverters is connected in parallel with a corresponding fixed gain inverter of the plurality of fixed gain inverters on one of a first arm and a second arm connected to the optical modulator; and setting an amplification strength for the plurality of tunable inverters based on the operational characteristics.

9 Claims, 10 Drawing Sheets

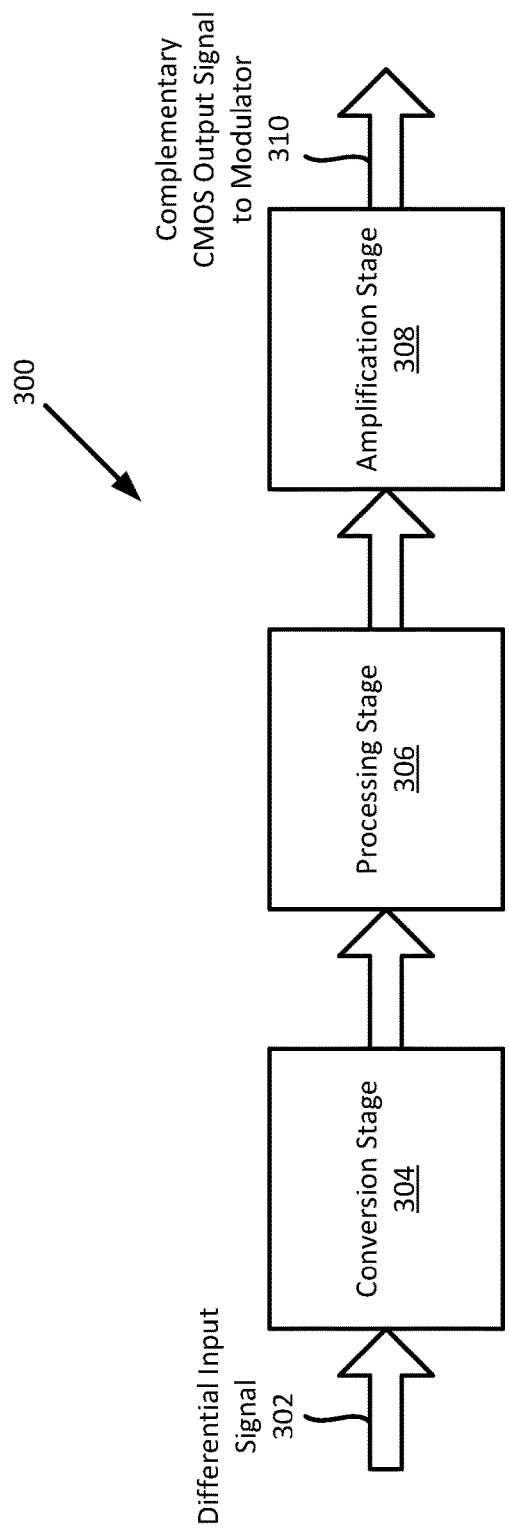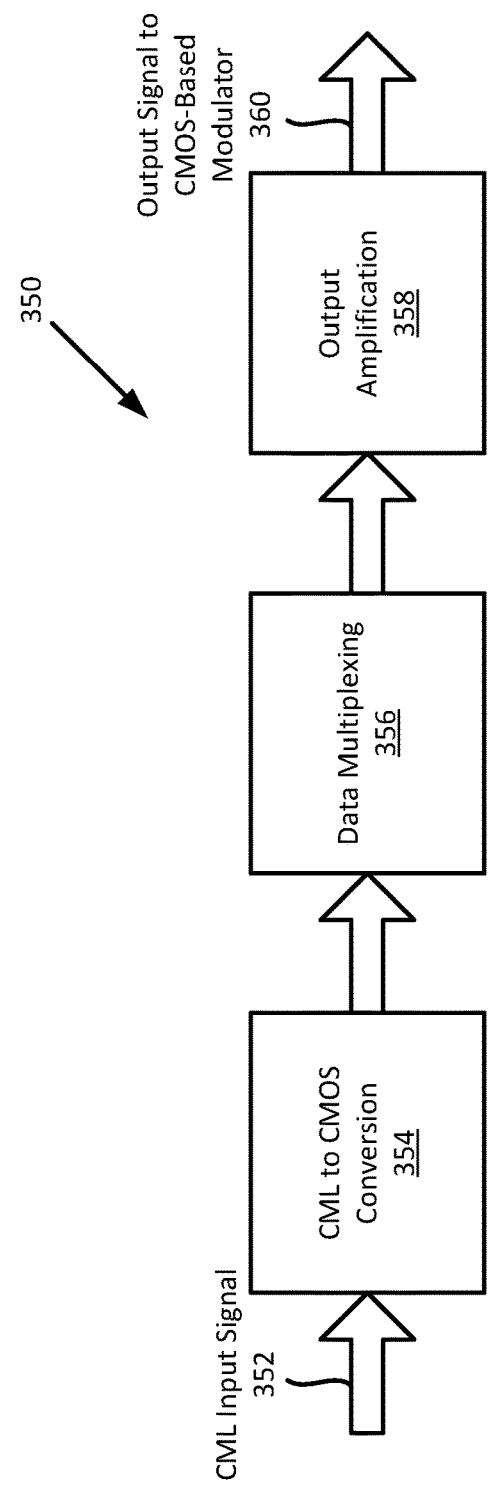

TUNABLE DRIVER

CROSS-REFERENCE TO RELATED APPLICATIONS

This application is a divisional of co-pending U.S. patent application Ser. No. 16/417,295 filed May 20, 2019. The aforementioned related patent application is herein incorporated by reference in its entirety.

TECHNICAL FIELD

Embodiments presented in this disclosure generally relate to drivers for use with Mach-Zehnder Interferometers (MZI) and other optical modulators. More specifically, embodiments disclosed herein provide for more consistent operation in the process corners, improving power consumption, bandwidth availability, and process yield.

BACKGROUND

The power consumption for an optical modulator driver is determined by the capacitive load driven, the frequency of operation, the voltage supply, the choice of CMOS (Complementary Metal-Oxide Semiconductor) technology, and the architecture of the modulator. When fabricating a batch of modulator drivers, however, small variations in the design can result in various modulator drivers that meet production specifications, but have vastly different power consumption requirements. The conforming modulator drivers on either end of the production specification for a given construction are referred to herein as the process corners. In an MZI or other modulator with two arms, modulator driver process corners may include modulator drivers that have drivers on one end of the specification (e.g., "fast" drivers) or on the other end of the specification (e.g., "slow" drivers). Each of the process corners for a given construction may exhibit different power consumption requirements, and a driver may be chosen for modulators of that construction based on the highest required power consumption for one of the process corners.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIGS. 3A and 3B are block diagrams of a driver, according to embodiments described herein.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
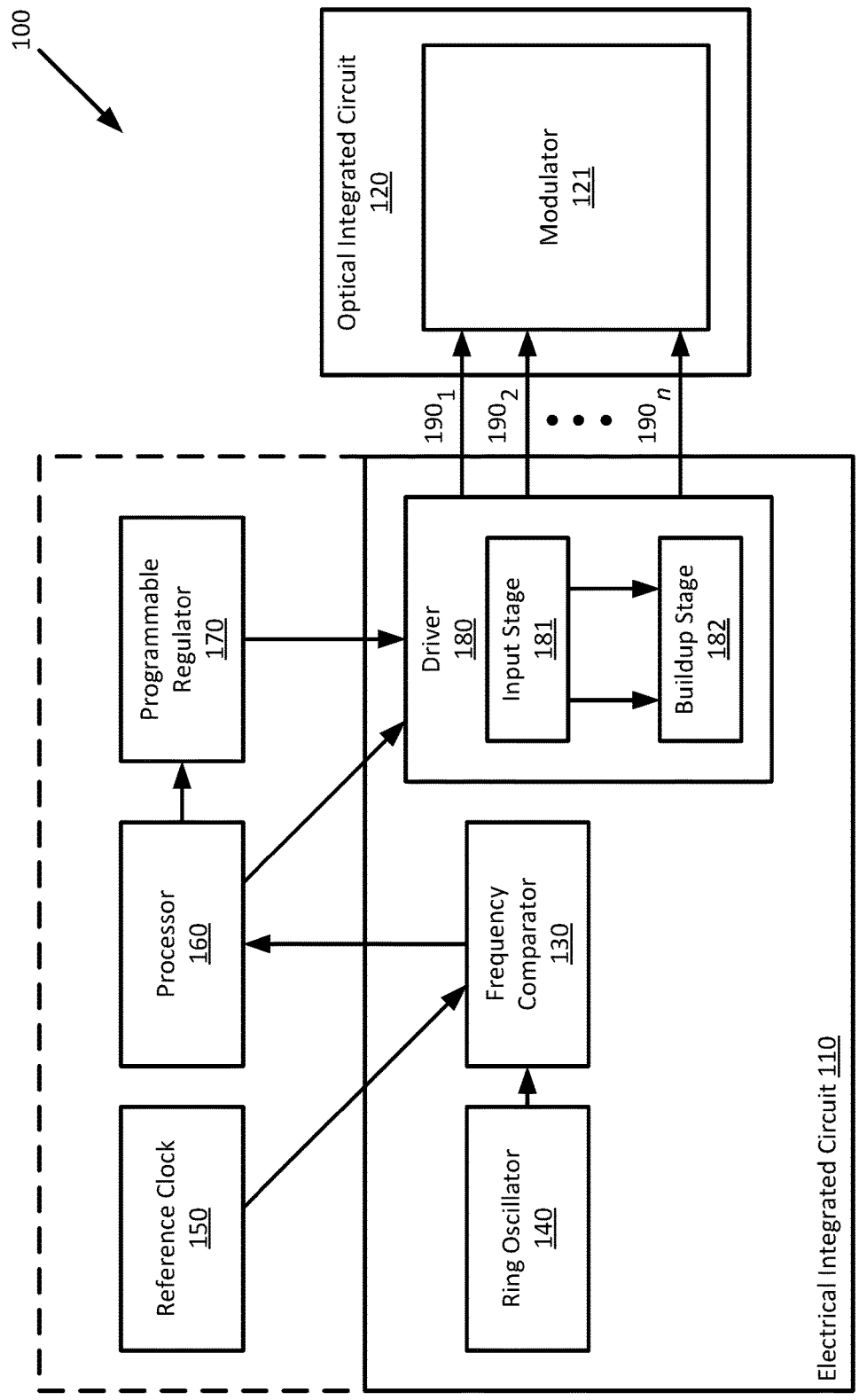
FIG. 1 is a block diagram of a photonic platform, according to embodiments of the present disclosure.

One embodiment presented in this disclosure provides a tunable driver circuit comprising: a plurality of buffers arranged in series, wherein a given buffer of the plurality of buffers is configured to accept a first input and a second input, and to produce a first output and a second output, and wherein each buffer of the plurality of buffers, comprises: a first tunable inverter, electrically connected to a first input node that is configured to receive the first input and to a first output node that is configured to carry the first output; a first fixed inverter, electrically connected in parallel with the first tunable inverter to the first input node and to the first output node; a second tunable inverter, electrically connected to a second input node that is configured to receive the second input and to a second output node that is configured to carry the second output; a second fixed inverter, connected in parallel with the second tunable inverter to the second input node and to the second output node; a first cross-coupled inverter, having an input connected to the first input node and an output connected to the second input node; and a second cross-coupled inverter, connected in parallel with the first cross-coupled inverter and having an output connected to the first input node and an input connected to the second input node.

One embodiment presented in this disclosure provides a method for tuning a tunable driving circuit, the method comprising: monitoring a frequency of a ring oscillator of an electrical integrated circuit connected to an optical modulator to determine operational characteristics of the electrical integrated circuit; setting, based on the operational characteristics, a driving voltage for a plurality of tunable inverters and a plurality of fixed gain inverters that control the optical modulator, wherein each tunable inverter of the plurality of tunable inverters is connected in parallel with a corresponding fixed gain inverter of the plurality of fixed gain inverters on one of a first arm and a second arm connected to the optical modulator; and setting an amplification strength for the plurality of tunable inverters based on the operational characteristics.

One embodiment presented in this disclosure provides an electrical integrated circuit, comprising: a frequency comparator, connected to a ring oscillator and an external reference clock signal, configured to determine operational characteristics of an electrical circuit connected to an optical modulator based on a frequency difference between the ring oscillator and the reference clock signal; an electrical driver connected with the optical modulator and configured to drive a phase shift of a first optical signal carried on a first arm of the optical modulator relative to a second optical signal carried on a second arm of the optical modulator, the electrical driver comprising: a first signal pathway, connected to the first arm of the optical modulator, wherein the first signal pathway includes: a first inductor, electrically connected to a first node on the first signal path and a second node on the first signal path; a first tunable gain inverter, electrically connected to the second node on the first signal pathway and a third node on the first signal pathway; and a first fixed gain inverter, electrically connected to the second node and the third node.

EXAMPLE EMBODIMENTS

The present disclosure provides systems and methods for tuning an electrical driver of an optical modulator based on the operational switching characteristics of the individual modulator driver connected with and driven by a given electrical driver. Rather than setting the driving voltage and amplification characteristics of the electrical driver based on most-power-intensive operational characteristics for a modulator (e.g., the worst-case power consumption characteristics of a modulator still compliant with design parameters/specification for that type/class/part-number of modulator) regardless of actual operational characteristics of an individual modulator, the driver circuitry described herein allows for the driving voltage and amplification characteristics to be matched to how an individual modulator operates. By individualizing the driving voltage and amplification characteristics of an electrical driver, a fabricator of photonic platforms (or devices for use therein) may thus improve power consumption in less-power-intensive process corners (e.g., avoiding over supplying of voltage to individual components), increase signaling bandwidth availability, and boost process yields by expanding the operational characteristics that define the process corners that meet the design parameters/specifications for a class of modulators.

FIG. 1 is a block diagram of a photonic platform 100 that includes an electrical integrated circuit (EIC) 110 and an optical integrated circuit 120 (OIC). The EIC 110 and OIC 120 include different components that are fabricated using different processes and are joined together to provide electrical control and monitoring of optical signals as well as monitoring of the process corner behavior of the EIC 110.

The EIC 110 includes a frequency comparator 130, a ring oscillator 140, and an electrical driver 180 (generally, driver 180) that is connected to the OIC 120. In some embodiments, the EIC 110 includes a reference clock 150, a processor 160, and a programmable voltage regulator 170. In some embodiments, one or more of the reference clock, 150, the processor 160, and the regulator 170 may be provided externally to the EIC 110, such as by temporary connection to test equipment, or a connection with a second electrical circuit.

The OIC 120 includes an optical modulator 121, such as a Mach-Zehnder Interferometer (MZI). The OIC 120 may include one or several optical modulators 121, each associated with a connection to the driver 180, as well as other optical elements (and associated electrical interconnects) such as, but not limited to: waveguides, optical interfaces (e.g., to optically connect the OIC 120 to a second optical circuit or an optical cable), light detectors, light generators, lenses, reflectors, etc.

During self-test or external calibration, EIC 110 and the OIC 120 are connected, and the frequency comparator 130 compares the frequency of the ring oscillator 140 with a clock signal from the reference clock 150 to determine the operational characteristics of the driver 180. Depending on how the driver 180 is fabricated, the individual arms of the driver 180 may exhibit different operations characteristics, typically classified as Fast (denoted as F), Slow (denoted as S), or Typical (denoted as T) that indicate the duty cycle of an N or a P channel in the modulator 121. Fast corners exhibit carrier mobilities that are higher than Typical and Slow corners, and Slow corners exhibit carrier mobilities that are lower than Typical and Fast corners, which affects the speed at which a given transistor in the driver 180 is able to switch and the amount of power required to affect that transistor to switch.

The frequency comparator 130 provides a Process/Voltage/Temperature (PVT) readout to the processor 160, which may be burnt into the EIC 110 as a chip fuse value. The processor 160 interprets the frequency of the ring oscillator 140 to determine which process corner (e.g., FF, FS, TT, SF, or SS) the driver 180 belongs to, and how to set/tune the driver 180 to account for the process corner. The processor 160 sets the gain of one or more tunable inverters in the buildup stage 182 of the driver 180 to account for the identified process corner of the driver 180, and sets the supply voltage of the regulator 170 accordingly. Setting the programmable drive of each tunable inverter in the buildup stage 182 controls for excessive peaking across the range of process variation in the driver 180, which protects the transistors from damage (e.g., due to over voltage) and reduces optical eye closure in the optical signals modulated by the modulator 121.

The regulator 170 provides a supply voltage (denoted herein as $V_{DD}$) as a driving voltage and/or a reference voltage for various components of the driver 180 (including the input stage 181 and the buildup stage 182), which controls the strength and power consumption of the driver 180. By matching the power supplied to the process corner that an individual driver 180 exhibits, the regulator 170 may apply a more consistent amount of power to different process corners and use less power in Fast and Typical process corners than a regulator 170 configured to supply a power level based on the performance characteristics of a Slow process corner.

As illustrated, the driver 180 includes an input stage 181 and a buildup stage 182, although several input stages 181 and buildup stages 182 may be included to control several modulators 121 or elements thereof. The input stage 181 may include various pass through termination and differential amplification circuitry, such as the examples illustrated and discussed in greater detail in regard to FIGS. 5A and 5B. The buildup stage 182 amplifies and adjusts the strength of the differentiated signals produced in the input stage 181 and supplies the amplified signals $190_{1-n}$ to the modulator 121. The number n of amplified signals 190 is based on the number of modulators 121 and individually driven stages thereof on the OIC 120. Example circuitry for a buildup stage 182 is discussed in greater detail in regard to FIGS. 6 and 7.

Figure 2A:
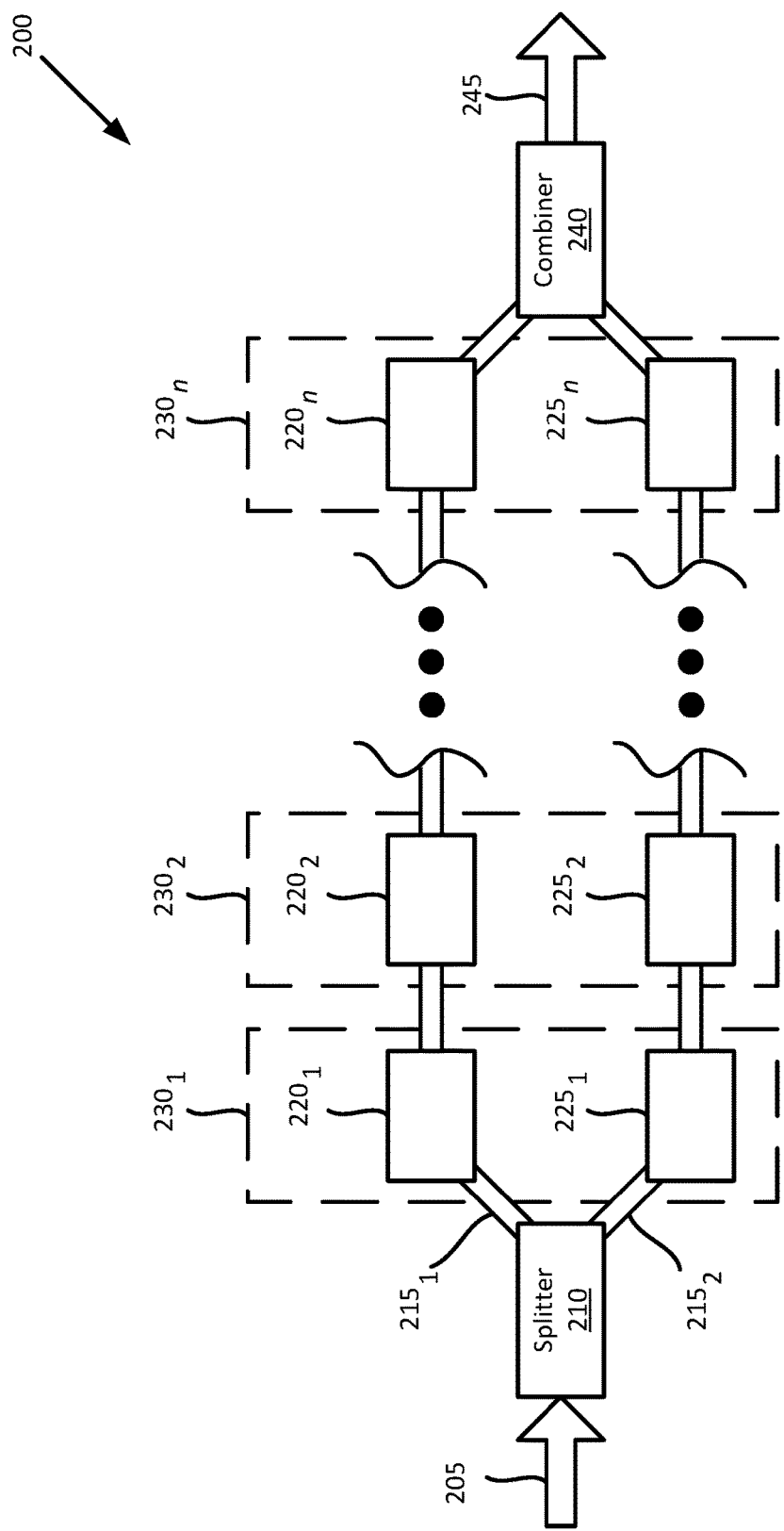
FIG. 2A illustrates a multi-segment electro-optic modulation device, such as may be used as a modulator, according to embodiments described herein.

FIG. 2A illustrates a multi-segment electro-optic modulation device, such as may be used as a modulator 121 according to embodiments described herein. Specifically, FIG. 2A illustrates an MZI-type modulation device 200 that includes an input 205 that receives an optical signal (e.g., a continuous wave signal) and an output 245 that transmits an optical signal that is modulated based on the electrical signals that are used to drive optical modulator segments $220_{1-n}$, $225_{1-n}$. The input 205 includes a splitter 210 (e.g., a y-splitter) that splits an incoming continuous wave into each of branches $215_1$, $215_2$. The split optical signals each pass through various modulation segments $220_{1-n}$, $225_{1-n}$ as described above. The modulation segments 220, 225 of each branch 215 may be grouped into pairs 230, such that pair $230_1$ corresponds to modulation segments $220_1$ and $225_1$, pair $230_2$ to modulation segments $220_2$ and $225_2$, and so forth. In one embodiment, at least one of the pairs 230 is used for thermal biasing of the modulation device 200. For example, the modulation device 200 may be DC biased at the quadrature point by providing appropriate signals to the thermal biasing pair(s) to heat a portion of the modulation device 200 (referred to as a DC bias section (not illustrated). While n segments are illustrated for each branch $215_1$, $215_2$, differing numbers of modulating segments per branch are also possible. The modulated optical signals from each of the branches 215 are then recombined using a combiner 240 (e.g., a y-combiner) to form a modulated output optical signal at output 245. Moreover, the structure shown in modulation device 200 may be used in conjunction with any of the modulators and features disclosed herein.

Figure 2B:
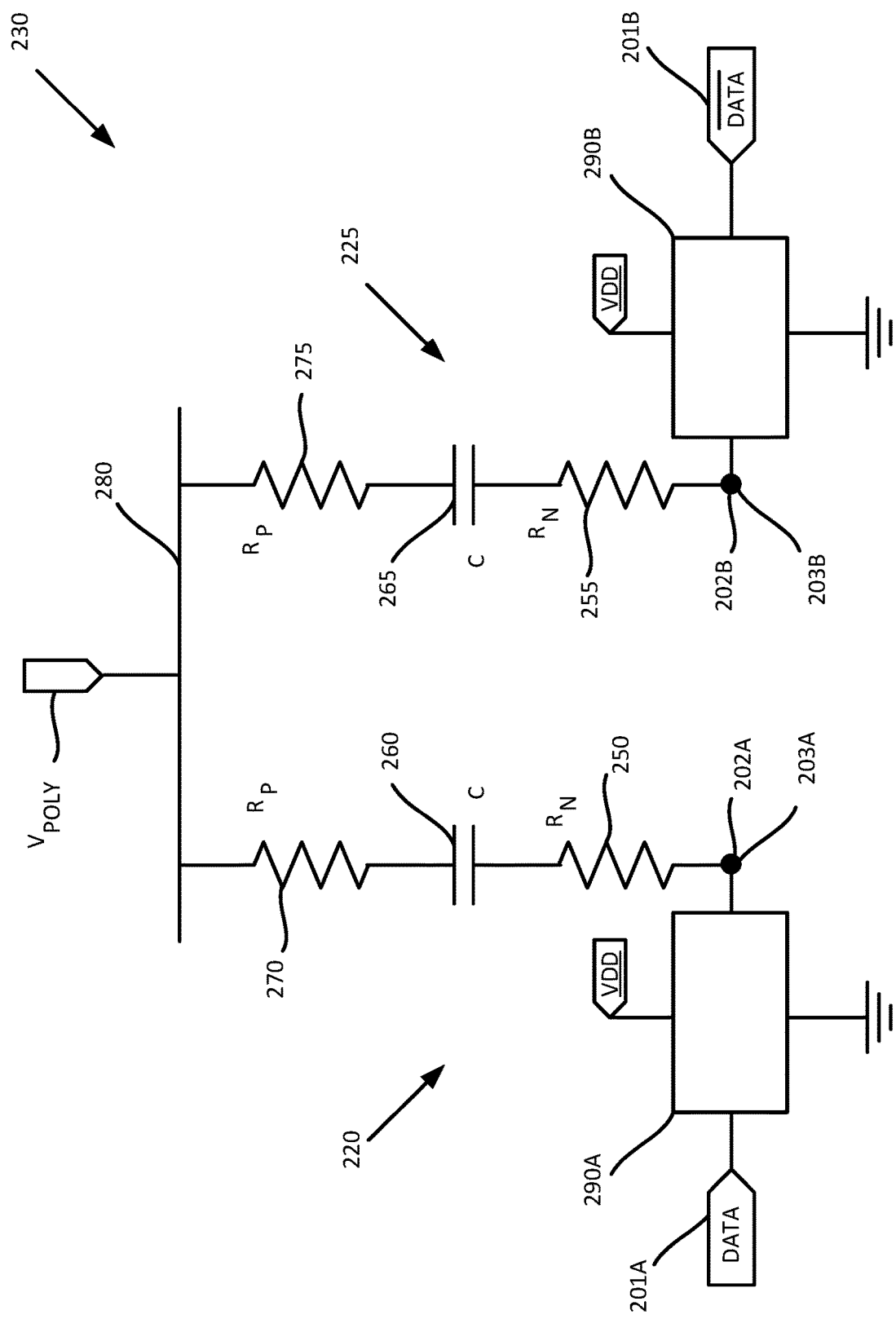
FIG. 2B is a schematic view of a modulator segment coupled with outputs of an exemplary modulator driver, according to embodiments described herein.

FIG. 2B is a schematic view of a modulator segment pair 230 coupled with outputs of the modulator driver 180, according to embodiments described herein. Specifically, the view represents an electrical equivalent model of a pair 230 of modulator segments 220, 225 of a modulator 121 of a SISCAP (Silicon-Insulator-Silicon Capacitor) device.

Each modulator segment 220, 225 includes a resistance $R_P$ (respectively shown as resistors 270, 275) that represents the resistance of the P-type region of the SISCAP device, and a resistance $R_N$ (respectively shown as resistor 250, 255) representing the resistance of the N-type region. The resistances $R_P$, $R_N$ of each modulator segment 220, 225 are coupled through a capacitance C (respectively shown as capacitors 260, 265), which generally represents the capacitance across a gate oxide, or gate dielectric of the SISCAP device (also referred to as a capacitive junction). In a SISCAP device, typically one of the N and the P plates of the capacitors 260, 265 is driven by the driver 180 at different voltages according to respective data signals 201A, 201B (generally, data signal 201), and the other plate is held at a constant DC voltage, $V_{poly}$ (represented by connection 280). Although FIG. 2B illustrates that the P-type regions are held at $V_{poly}$ and the N-type regions are driven at the variable voltage of the data signals 201, in other embodiments, the N-type regions may be held at $V_{poly}$ and the P-type regions driven according to the data signals 201.

As shown, the electrical contacts of the N-type region are coupled at inputs 202A, 202B (generally, input 202) with a first arm 290A (generally, amplifier arm 290) and a second arm 290B of an amplifier chain of the driver 180 that that respectively provide a data signal 201A and a complement data signal 201B. Each amplifier arm 290 is driven at a shared voltage $V_{DD}$ and includes various inverters, inductors, Electro-Static Discharge (ESD) protection devices (also referred to as ESD protectors), which are discussed in greater detail in regard to FIGS. 6 and 7 herein. Each amplifier arm 290 receives the respective data signal 201 and outputs an amplified data signal 203A, 203B (generally, amplified data signal 203) onto a corresponding input 202A, 202B of the pair 230. As such, the amplified data signals 203 generally represent the full rail-to-rail data signal 201, albeit at a different voltage that is matched to the capabilities of the SISCAP device. In embodiments using an even number of inverters, if data signal 201A corresponds to the data (DATA) and data signal 201B corresponds to the logical complement of the data ($\overline{DATA}$, not(DATA), DATA*, etc.), then the amplified data signal 203A corresponds to the data and the amplified data signal 203B corresponds to the complement. In embodiments using an odd number of inverters, if data signal 201A corresponds to the data (DATA) and data signal 201B corresponds to the logical complement of the data ($\overline{DATA}$, not(DATA), DATA*, etc.), then the amplified data signal 203A corresponds to the complement and the amplified data signal 203B corresponds to the data.

FIGS. 3A and 3B are block diagrams of a driver 180, according to embodiments described herein. Generally, driver arrangement 300 illustrates an example of the high-level functionality of a driver 180, and driver arrangement 350 illustrates one example implementation of the driver arrangement 300. Although the functionality of driver arrangement 300 is illustrated as a sequence of a plurality of functional stages, alternative embodiments may provide different sequences or different functional stages. For example, the functional stages (or portions of the stages) may be performed in a different order, may include additional stages or omit certain stages, or may perform certain functional stages contemporaneously. Additionally, various functional stages may be provided as separate integrated circuits, or some or all of the functional stages included within a shared integrated circuit.

As shown, driver arrangement 300 receives a differential input signal 302. Generally, differential signaling is a method of transmitting information electrically using two complementary signals sent on two paired wires or traces (called a differential pair). Because external signal interference, such as noise, tends to affect both wires in a similar manner, and because the transmitted information is contained in the difference between the complementary signals, differential signaling generally offers improved resilience to electromagnetic noise when compared with single-ended signaling. Generally, single-ended signaling transmits information using one signal relative to an unpaired reference voltage (e.g., ground). The noise immunity of differential signaling may be advantageous for use with low-voltage, high-speed electronics systems, such as modern communications systems. The differential input signal 302 may be an analog signal or digital.

In many cases, the modulator 121 may require particular signal characteristics at an input that do not match the characteristics of the data included in the differential input signal 302 (e.g., which may be dictated by a communications standard). In some embodiments, the modulation efficiency of the modulator 121 depends on a voltage output range provided by the circuitry of the driver 180 as well as where the operational characteristics of the modulator 121 fall within the production margins for that type of modulator 121. For example, a first compliant modulator 121 in a first process corner may require X mW (milliwatts) of power, whereas a second compliant modulator in a second process corner may require Y mW of power. By adjusting the supply voltage and inverter gains for particular process corners, rather than setting the driver 180 based on the requirements of one particular process corner, a fabricator may reduce the difference in the power consumption in opposite process corners (e.g., reducing Δ(X, Y)) due to process variations in fabricating the driver 180.

At the conversion stage 304, the differential input signal 302 is converted by driver circuitry to produce a complementary CMOS signal. Among other functions, conversion may include various stages of amplification of the differential input signal. In one embodiment, the conversion stage 304 provides a rail-to-rail complementary CMOS output signal. The information included in the complementary CMOS signal may be further processed in a processing stage 306, and the resulting signal may be amplified in an amplification stage 308 to generate a complementary CMOS output signal 310 suitable for driving a modulator. The amplification stage 308 may include a number of stages of amplifier circuitry that collectively boost the output signal into a desired voltage range for operating the modulator 121.

Driver arrangement 350 provides one example of the driver arrangement 300. A current-mode logic (CML) input signal 352 is received at a CML-to-CMOS conversion stage 354 of the driver arrangement 350. CML is one type of differential digital logic family, generally configured to transmit data at rates of up to 40 gigabits per second (Gb/s) and higher using printed circuit boards. CML is commonly used in the design of high-speed electronic systems due to a relatively small output voltage swing and a relative fast current switching. As with other logic families, CML may specify additional requirements, such as termination circuitry (discussed further below). In one embodiment, the CML-to-CMOS conversion stage 354 includes a differential amplifier whose output is coupled with at least one transimpedance amplifier (TIA). In one embodiment, the CML-to-CMOS conversion stage 354 includes one or more amplification stages following the TIA(s) to boost the signal to a rail-to-rail complementary CMOS output signal suitable for driving a CMOS-based modulator.

The output signal from the CML-to-CMOS conversion stage may have additional processing performed before being amplified to desired output levels for the modulator 121. As shown, a data multiplexing stage 356 allows the output signal data to be changed during operation. For example, the data multiplexing stage 356 may allow a test signal or other desired signal to be selected for output to the modulator 121. Following the data multiplexing stage 356, the signal is amplified at output amplification stage 358 to an output signal 360 having an output range suitable for driving the CMOS-based modulator.

Figure 4:
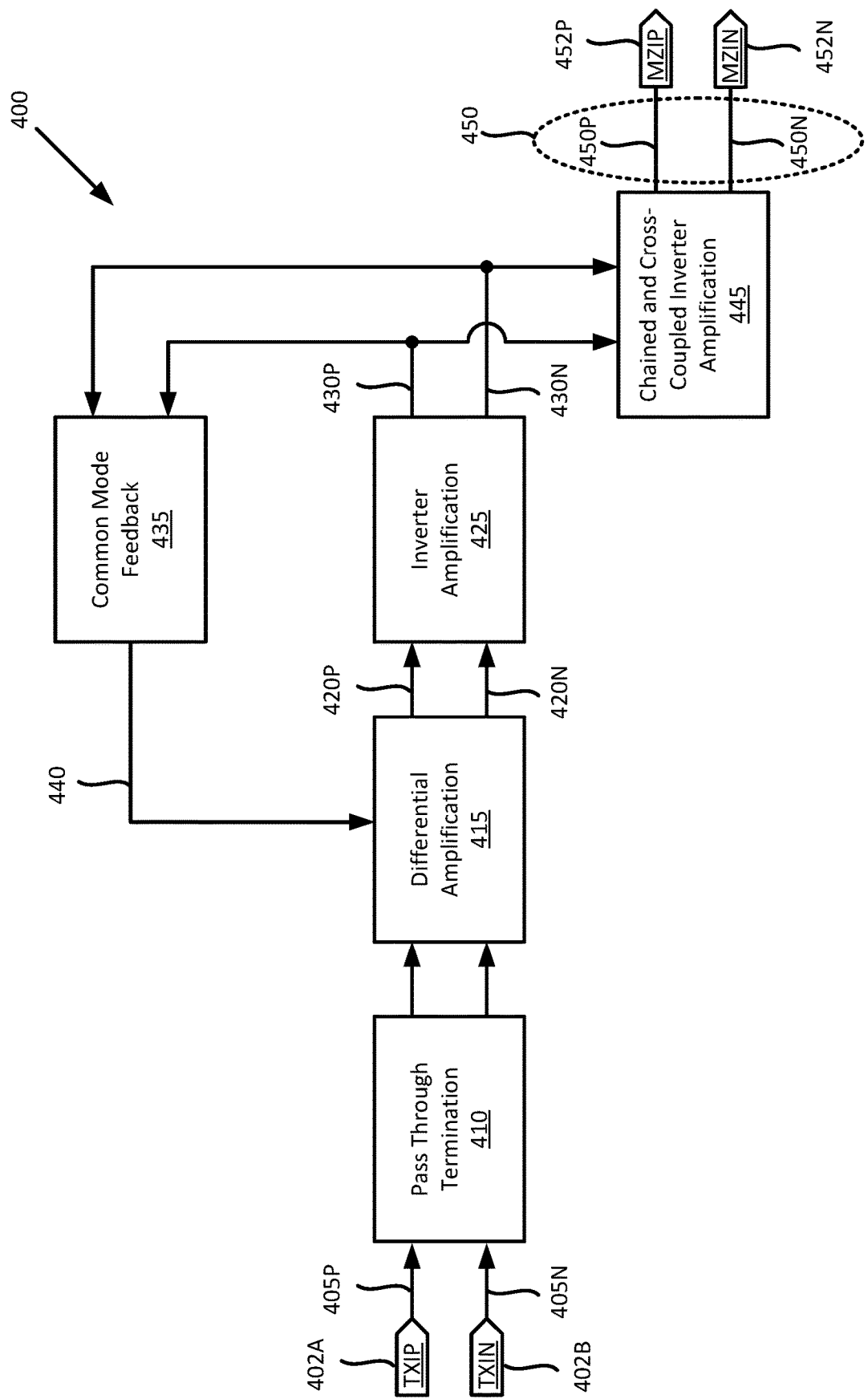
FIG. 4 is a block diagram of an exemplary conversion stage of a modulator driver, according to embodiments described herein.

FIG. 4 is a block diagram of an exemplary conversion stage of a modulator driver 180, according to embodiments described herein. The conversion stage 400 generally corresponds to the CML-to-CMOS conversion stage 354 in FIG. 3B.

The CML input signal 352 is received at differential inputs 402A, 402B. The differential signals 405P, 405N corresponding to the CML input signal 352 pass through termination circuitry 410 prior to being received at the differential amplification stage 415. For example, according to CML requirements, the termination circuitry 410 may include a 50 Ohm (Ω) resistor for each differential input 402, as well as a pull-up to a reference voltage (such as $V_{DD}$). One example of termination circuitry 410 is provided in FIG. 5A.

The differential signals 405N, 405P are received at the differential amplification stage 415 and amplified. The output signals 420N, 420P from the differential amplification stage 415 are provided to a first inverter amplification stage 425. In one embodiment, the inverter amplification stage 425 includes one or more TIAs. In one embodiment, the inverter amplification stage 425 includes one TIA applied to each output signal 420N, 420P. Outputs of the first inverter amplification stage 425 are signals 430N and 430P. Each of the signals 430N, 430P is provided to a common-mode feedback stage 435 and to a chained and cross-coupled inverter amplification stage 445. Based on the signals 430N, 430P, the common-mode feedback stage 435 outputs a control signal 440 to the differential amplification stage 415. The control signal 440 is used to control the biasing of the inverter amplification stage 425 by modifying properties of the output signals 420N, 420P.

The chained and cross-coupled inverter amplification stage 445 includes one or more stages of coupling inverters, which include cross-coupled inverters. The output signals 450N, 450P from the chained and cross-coupled inverter amplification stage 445 are provided to outputs 452P, 452N and collectively are considered the output signal 450. In one embodiment, the output signal 450 from the conversion stage 400 is a rail-to-rail complementary CMOS signal, having an output range suitable for driving a CMOS-based modulator 121.

Figure 5A:
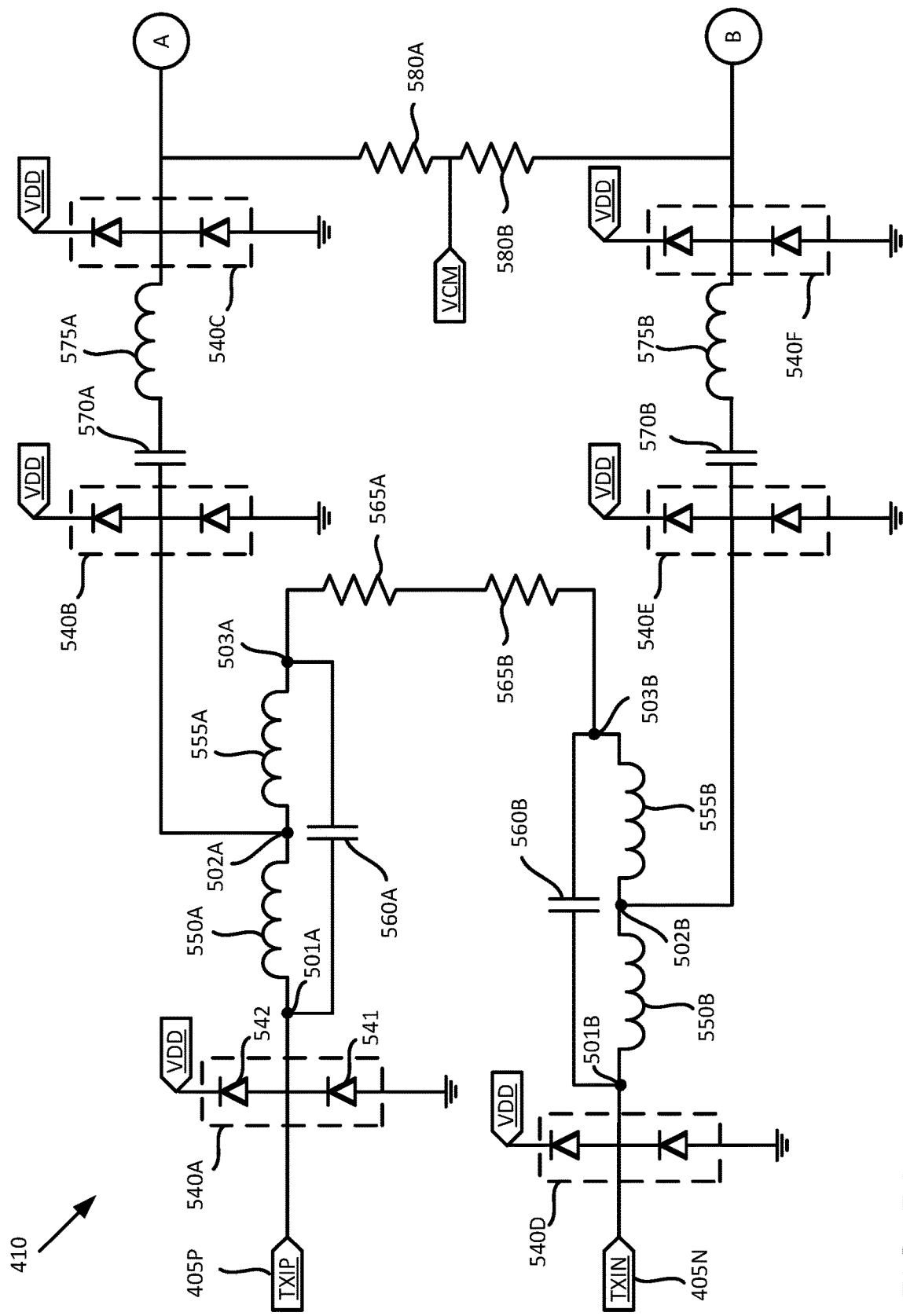
FIGS. 5A and 5B provide a schematic view of an input stage of a driver, according to embodiments of the present disclosure.
Figure 5B:
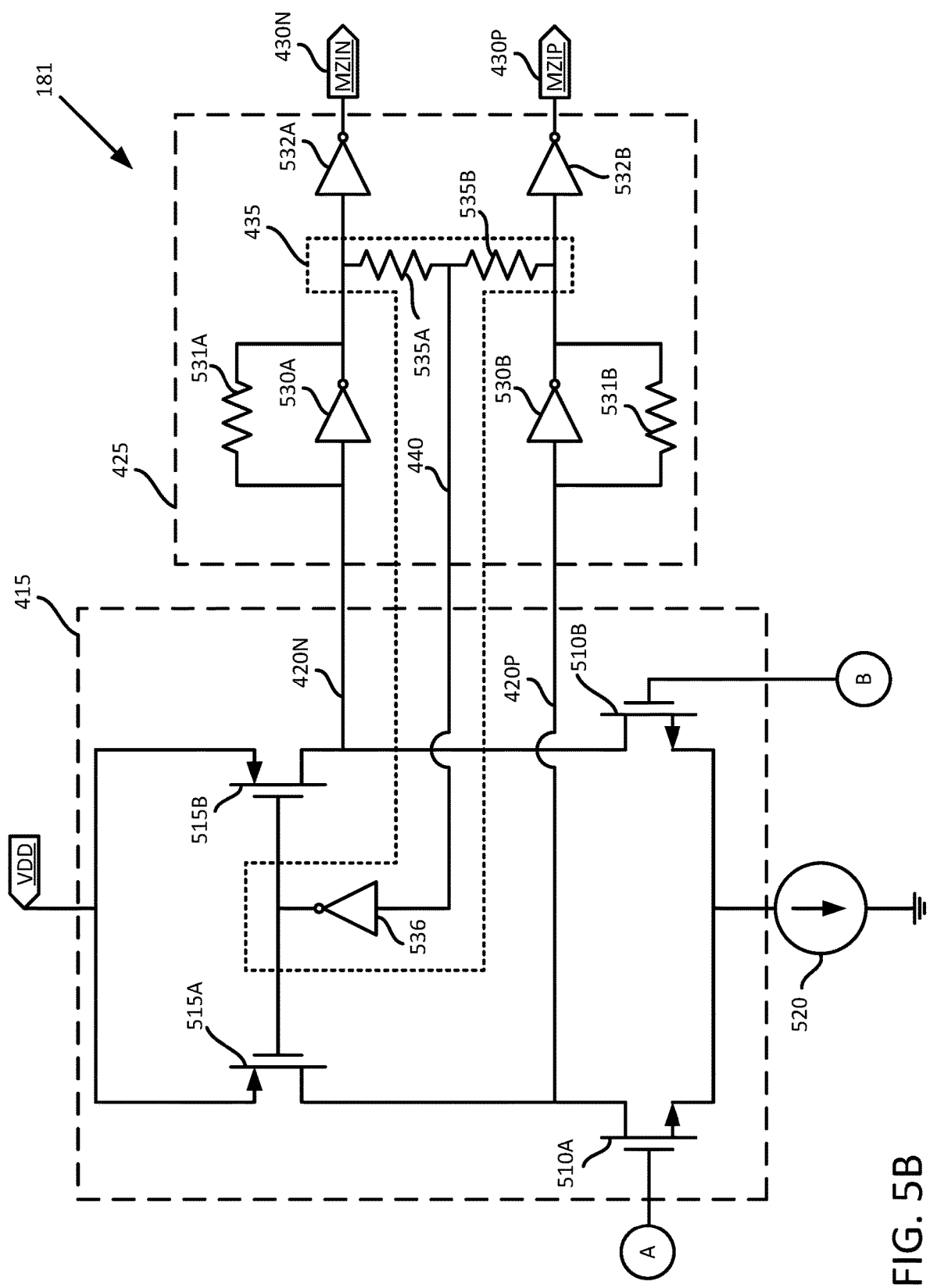

FIGS. 5A and 5B provide a schematic view of an input stage 181 of a driver 180, according to embodiments of the present disclosure. FIG. 5A illustrates a first portion of the input stage 181, generally corresponding to pass through termination circuitry 410. FIG. 5B generally corresponds to a differential amplification stage 415, an inverter amplification stage 425, and common-mode feedback stage 435 provided to a first inverter amplification stage 425.

FIG. 5A illustrates an embodiment of pass through termination circuitry as may be used in the termination circuitry 410. The pass through termination circuitry of the termination circuitry 410 receives the differential signals 405P, 405N and carries the differential output signals 405P, 405N on two arms to terminals A and B to the circuitry of the differential amplification stage 415, and example of which is illustrated in FIG. 5B.

The pass through termination circuitry 410 includes three sets of Electrostatic Discharge (ESD) protectors 540A-F (generally, ESD protector 540) on each arm, which include a first diode 541 connected from ground to the arm, and a second diode 542 connected from the arm to a reference voltage, such as $V_{DD}$.

Each arm includes an inductive pass-through voltage divider, such as a T-Coil structure, that includes a first inductor 550A, 550B in series/coupled with a second inductor 555A, 555B, and a pass-through bridge capacitor 560A, 560B parallel to the inductors. The first inductor 550A, 550B is connected to a first node 501A, 501B and a second node 502A, 502B respectively, and the second inductor 555A, 555B is connected to the second node 502A, 502B and a third node 503A, 503B respectively. The pass-through bridge capacitor 560A, 560B is connected at a first node 501A, 501B, and a third node 503A, 503B respectively.

Each arm runs to the first node 501A, 501B and from the second node 502A, 502B. A resistive voltage divider that includes a first dividing resistor 565A and a second dividing resistor 565B links the first arm with the second arm between the third nodes 503A, 503B. In various embodiments, the first dividing resistor 565A and the second dividing resistors 565B are of the same resistance, but different resistances may be used in other embodiments to define a different ratio between the two arms and one or more termination resistors (not illustrated) may be added to each arm to reduce back reflection of signals carried thereon.

A capacitance and inductance between the second ESD protector 504B and the third ESD protector 504C is represented in FIG. 5A as capacitor 570A and inductor 575A. Similarly, a capacitance and inductance between the fifth ESD protector 504E and the sixth ESD protector 504F is represented in FIG. 5A as capacitor 570B and inductor 575B.

A resistive voltage divider that includes a first dividing resistor 580A and a second dividing resistor 580B links terminal A and terminal B together after the third ESD protector 504C and the sixth ESD protector 504F. In various embodiments, the first dividing resistor 580A and the second dividing resistors 580B are of the same resistance, to define a reference voltage $V_{CM}$ halfway between that observed at terminals A and B. In various embodiments, the common mode voltage $V_{CM}$ is generated by a separate generator (not illustrated). The resistors create a high impedance connection to nodes A and B to set those nodes to the generated $V_{CM}$.

Turning now to FIG. 5B, the differential signals 405P, 405N are received from the circuitry of the termination circuitry 410 from terminals A and B, respectively, at the circuitry providing the differential amplification stage 415. The differential amplification stage 415 includes a differential amplifier that includes a first pair of MOS devices (i.e., transistors 510A, 510B; generally, first pair of MOS devices 510) having a first conductivity type (e.g., n-channel), with each of the first pair of MOS devices 510 configured to receive one differential signal 405P or 405N with reference to a source 520. Generally, the first pair of MOS devices 510 may also be referred to as a differential pair. The differential pair generally offers some noise immunity and common mode rejection, which results in an increased input sensitivity that is suitable for low voltage input signals. The differential amplifier also includes a second pair of MOS devices (i.e., transistors 515A, 515B; generally, second pair of MOS devices 515) having a different conductivity type (e.g., p-channel). Each of the second pair of MOS devices generally operates as a current source load for a respective MOS device of the first pair. For example, transistor 515A is coupled with transistor 510A, and 515B with 510B. The differential amplifier outputs signals 420P, 420N, represent the common mode output of the differential pair that is provided at the respective drains of the transistors 510A, 510B.

The output signals 420P, 420N are received at a first inverter amplification stage 425. As shown, the first inverter amplification stage 425 includes a first TIA coupled with one output of the differential amplifier, and a second TIA coupled with the other output of the differential amplifier. Each TIA includes a respective inverter 530A, 530B and feedback resistor 531A, 531B. The first inverter amplification stage 425 is generally configured to produce a second amplified signal (i.e., signals 430P, 430N) that is based on the first amplified signal (i.e., signals 420N, 420P). Because the input and output of each TIA is coupled through the respective feedback resistor 531, the input and common mode output of the TIAs may be controlled to have voltage values close to a trip point of the respective inverters 530. Additionally, the circuitry for the first inverter amplification stage 425 may include a second inverter 532A, 532B on each signal pathway. In embodiments that use an odd number of stages in the chained and cross-coupled inverter amplification stage 445 (discussed in greater detail in regard to FIGS. 6 and 7), the second inverters 532A, 532B may be omitted.

Although not illustrated in FIG. 5B, each of the inverters 530, 532, 536 may be powered using a shared driving voltage $V_{DD}$.

In some embodiments, any voltage offsets in the differential output signals 420N, 420P are mitigated by measuring the common mode at the output of the TIAs, and by comparing the common mode with the trip point of an inverter amplifier. A feedback or control signal 440 based on the difference value may be provided to the current source loads of the differential amplifier (i.e., transistors 515A, 515B) to adjust the common mode output of the differential pair. Adjustments made by the control signal 440 to the differential pair common mode output are propagated to the input of the TIAs, which in turn adjusts the bias of the TIAs to follow the trip point of the inverters 536. In some embodiments, the common mode output of the TIAs is select to have voltage values close to the trip point of a successive inverter in the sequence (e.g., inverters 532A, 532B), which results in a large gain to be available at the successive inverter, with nearly full rail-to-rail CMOS output levels produced by the successive inverter.

As shown, the common-mode feedback stage 435 includes resistors 535A, 535B that are each coupled with the output of a respective TIA, as well as with an input of an inverter 536. The trace carrying the control signal 440 may include one or more components for filtering or conditioning the control signal 440. For example, the output of inverter 536 may have a capacitor connected with voltage source $V_{DD}$ in order to perform frequency compensation. In one embodiment, the (conditioned) control signal 440 is coupled with the gates of the p-channel transistors 515A, 515B. In one embodiment, the characteristics of resistors 535A, 535B and/or inverter 536 are selected to provide a desired control signal 440.

Figure 6:
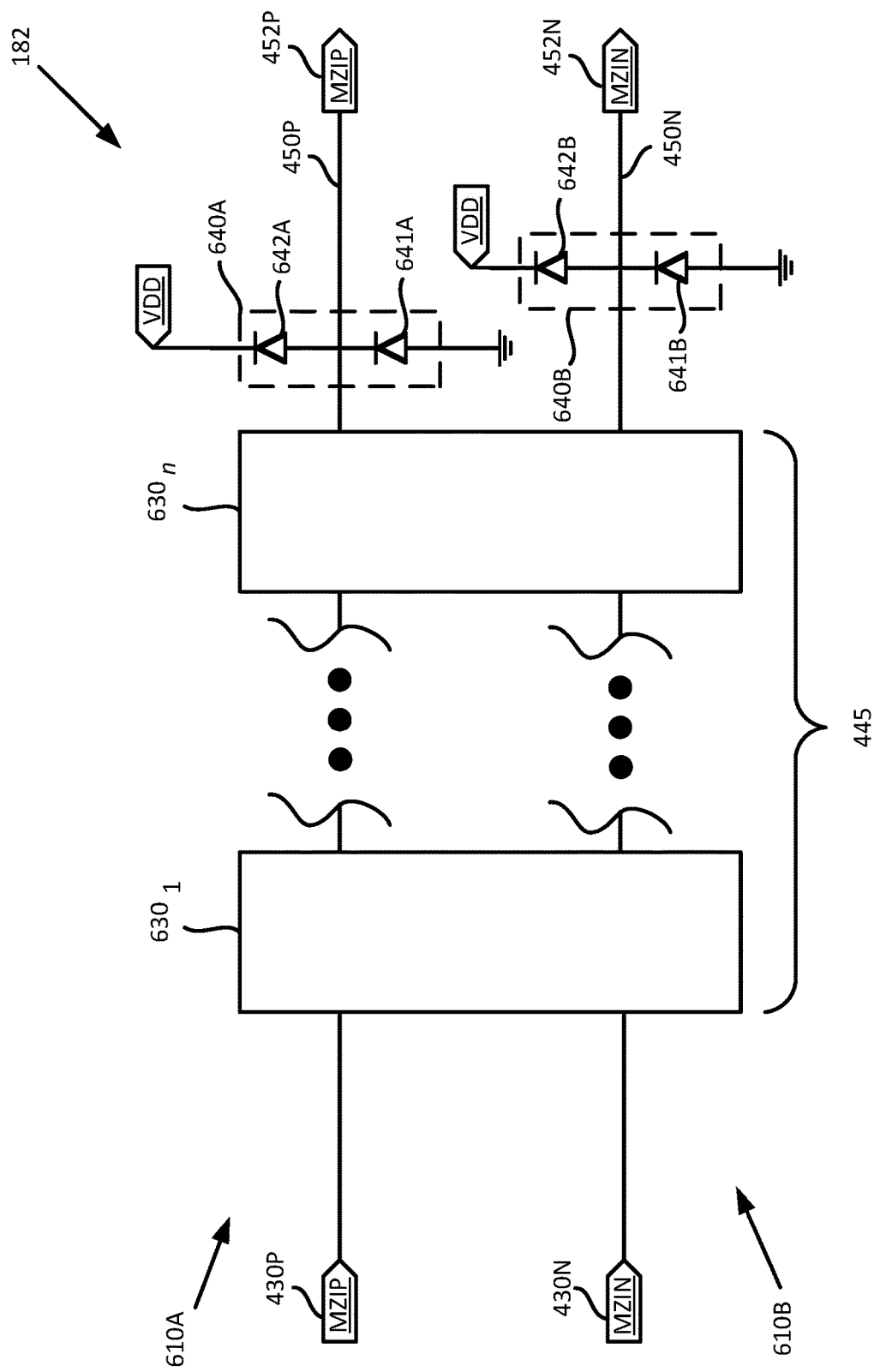
FIG. 6 illustrates a schematic view of a buildup stage including a chain of buffers arranged in series across a first arm and a second arm, according to embodiments of the present disclosure.

The signals 430N, 430P output by the arrangement illustrated in FIG. 5B may be provided to a buildup stage 182, such as that illustrated in FIG. 6. FIG. 6 illustrates a schematic view of the buildup stage 182 including a chain of buffers $630_{1-n}$ arranged in series across a first arm 610A and a second arm 610B. An example schematic view of an individual buffer 630 is provided in FIG. 7.

In FIG. 6, the first arm 610A receives the signal 430P, which is provided to the respective first-arm stages of the buffers $630_{1-n}$, which outputs signal 450P to the modulator 121. The second arm 610B in FIG. 6 receives the signal 430N, which is provided to the respective second-arm stages of the buffers $630_{1-n}$, which outputs signal 450N to the modulator 121.

In various embodiments, the first arm 610A and the second arm 610B include respective ESD protectors 640A, 640B between the last buffer 630n and the modulator 121. Each of the ESD protectors 640A, 640B includes a first diode 641A, 641B connected from ground to the respective arm, and a second diode 642A, 642B connected from the respective arm to a reference voltage $V_{DD}$.

Figure 7:
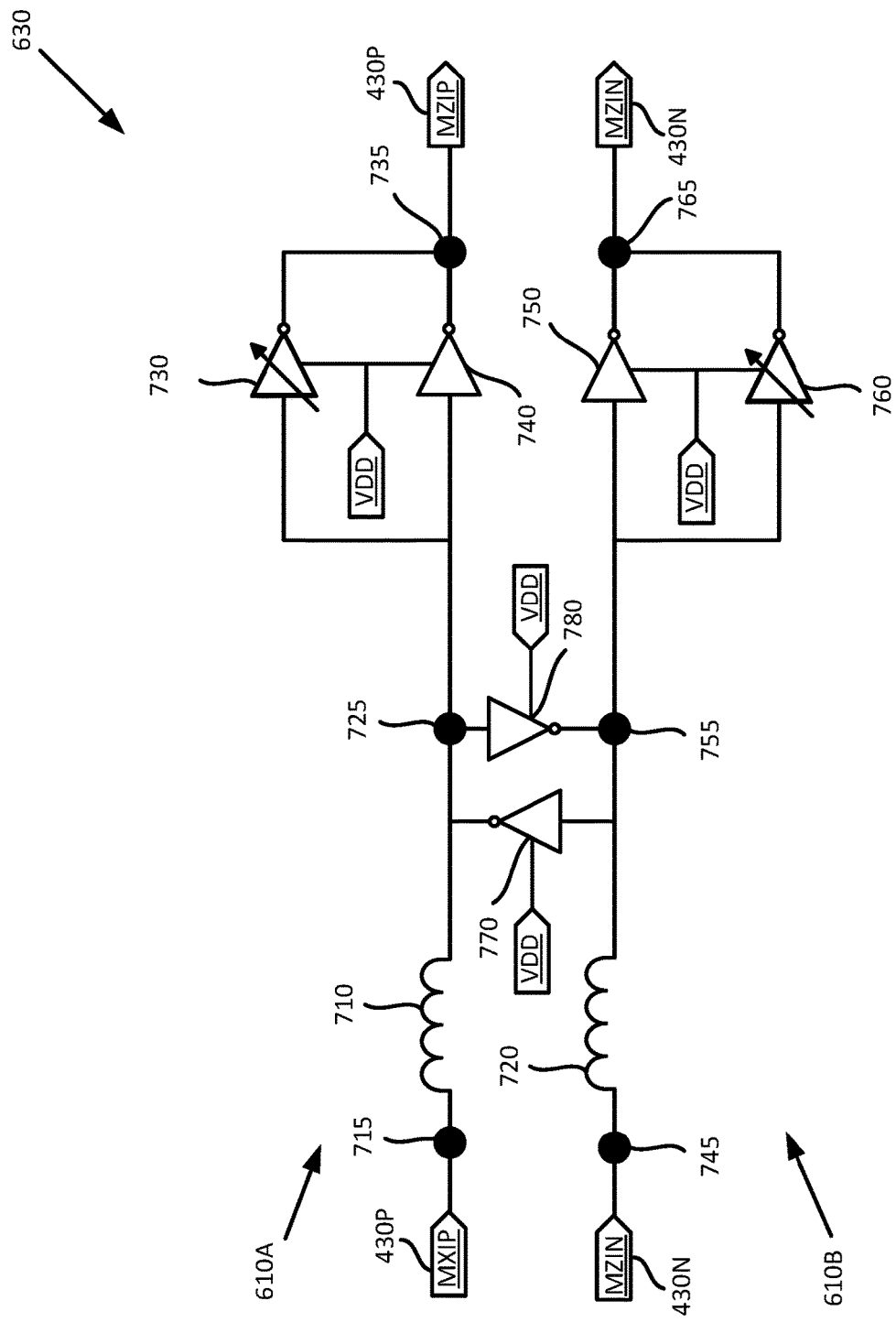
FIG. 7 illustrates a schematic view of an individual buffer, according to embodiments of the present disclosure.

FIG. 7 illustrates a schematic view of an individual buffer 630 in which the first arm 610A runs through a first node 715, a second node 725, and a third node 735 and the second arm 610B runs through a fourth node 745, a fifth node 755, and a sixth node 765. Successive buffers 630 are connected such that the third node 735 of a prior buffer $630_x$ is connected to the first node 715 of a successive buffer $630_{x+1}$ and the sixth of a prior buffer $630_x$ node is connected to the fourth node 745 of a successive bugger $630_{x+1}$. Any number of buffers $610_{1-n}$ may thus be arranged serially in a chain arrangement.

A first inductor 710 is disposed between the first node 715 and the second node 725, and a second inductor 720 is disposed between the fourth node 745 and the fifth node 755, which increases the available bandwidth for the signal carried across the buffer 630 without consuming additional power.

A cross-coupled pair of inverters 770 and 780 are disposed between the second node 725 and the fifth node 755 to provide DC offset correction. The first cross-coupled inverter 770 and the second cross-coupled inverter 780 are oriented in opposite orientations relative to one another.

A first adjustable gain inverter 730 and a first fixed gain inverter 740 are disposed in parallel to one another between the second node 725 and the third node 735. Similarly, a second fixed gain inverter 750 and a second adjustable gain inverter 760 are disposed in parallel to one another between the fifth node 755 and the sixth node 765. In some embodiments, the gain of the adjustable gain inverters 730, 760 of a subsequent buffer $630_{x+1}$ is higher than the gain of the adjustable gain inverters 730, 760 in a prior buffer $630_x$ in the buildup stage 182 so that the strength of the signal is progressively made stronger across the buildup stage 182.

Each of inverters 730, 740, 750, 760, 770, 780, have the same driving voltage $V_{DD}$ applied by the programmable regulator 170. The value of the driving voltage $V_{DD}$ and the gain programmed for the adjustable gain inverters 730, 760 are based on the operational characteristics of the modulator 121 that the buildup stage 182 is driving. By adjusting the gain and $V_{DD}$, a fabricator can mitigate the risk of excessive peaking within particular process corners, which can cause output optical eye closure and damage transistors in the modulator 121. The presently described driver 180 can thus drive signals for a wide variety of modulators 121 with a lower power consumption than comparable designs, because the driver 180 is optimized to the individual drive strength of a particular modulator 121 instead of the slow-slow process corner across all driver/modulator pairings as other drivers 180 are optimized for. This provides for a more consistent power consumptions across all process corners, and does not consumer additional power in the typical or fast process corners.

Figure 8:
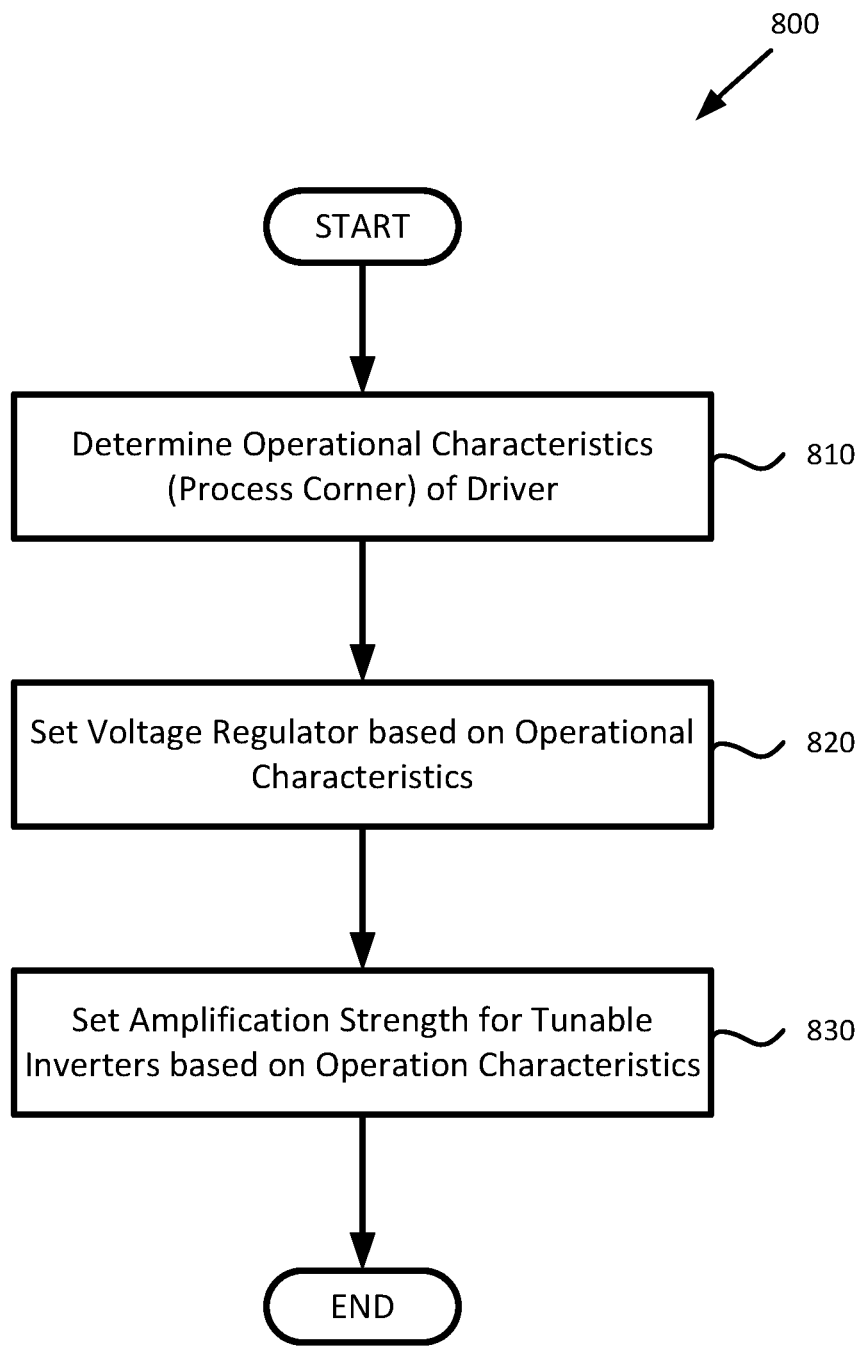
FIG. 8 is a flowchart of a method for tuning a driver for a modulator, according to embodiments of the present disclosure.

FIG. 8 is a flowchart of a method 800 for tuning a driver 180 for a modulator 121. Method 800 beings at block 810, where a processor 160 monitors a frequency of a ring oscillator 140 connected to the driver 180 to determine operational characteristics of the driver 180. In various embodiments, the operational characteristics include identifying a process corner that the driver 180 belongs to (e.g., Fast-Fast, Slow-Slow, Typical-Typical).

At block 820, the processor 160 sets a voltage regulator 170 to provide a reference voltage VDD to the driver 180 at an appropriate voltage level based on the determined operational characteristics of the driver 180. In various embodiments, the voltage VDD is used as a driving voltage or a reference voltage for various components in the driver 180 including ESD protectors, inverters (amplifying and cross-coupling), and transistors.

At block 830, the processor 160 sets an amplification strength of a plurality of tunable (i.e., adjustable gain) inverters included in a buildup stage 182 of the driver 180. In various embodiments, each signal of a differentiated signal is carried on a separate arm of the driver, and the tunable inverters on each arm are tuned separately based on the operation characteristics of the driver 180 to which the given arm of the driver 180 is connected. The tunable inverters are arranged in parallel with a paired non-tunable (i.e., fixed gain) inverter, and several pairs of inverters are arranged in series (with progressively larger strengths) within the buildup stage 182.

Method 800 may then conclude.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. An electrical integrated circuit, comprising:
a frequency comparator connected to a ring oscillator and an external reference clock signal, wherein the frequency comparator is configured to determine operational characteristics of an electrical circuit connected to an optical modulator based on a frequency difference between the ring oscillator and the external reference clock signal;
an electrical driver connected to the optical modulator and configured to drive a phase shift of a first optical signal carried on a first arm of the optical modulator relative to a second optical signal carried on a second arm of the optical modulator, the electrical driver comprising:
a first signal pathway connected to the first arm of the optical modulator, wherein the first signal pathway includes:
a first inductor electrically connected to a first node on the first signal pathway and a second node on the first signal pathway;
a first tunable gain inverter electrically connected to the second node and a third node on the first signal pathway; and
a first fixed gain inverter, electrically connected to the second node and the third node; and
a second signal pathway connected to the second arm of the optical modulator, wherein the second signal pathway includes:

a second inductor electrically connected to a fourth node and a fifth node on the second signal pathway;

a second tunable gain inverter electrically connected to the fifth node and a sixth node on the second signal pathway; and a second fixed gain inverter electrically connected to the fifth node and the sixth node.

2. The electrical integrated circuit of claim 1, wherein a first gain of the first tunable gain inverter and a second gain of the second tunable gain inverter are set based on the operational characteristics.

3. The electrical integrated circuit of claim 1, wherein the first signal pathway carries a first signal to the first arm of the optical modulator and the second signal pathway carries a logical complement of the first signal to the second arm of the optical modulator.

4. The electrical integrated circuit of claim 3, wherein the first signal is applied to a first capacitive junction of the first arm of the optical modulator and the logical complement is applied to a first capacitive junction of the second arm of the optical modulator, wherein a second capacitive junction of the first arm and a second capacitive junction of the second arm are held at a constant voltage.

5. The electrical integrated circuit of claim 1, further comprising:

a cross-coupling, including:

a first coupling inverter having a first input electrically connected to the second node and a first output electrically connected to the fifth node; and a second coupling inverter having a second output electrically connected to the second node and a second input electrically connected to the fifth node.

6. The electrical integrated circuit of claim 5, further comprising a voltage regulator configured to produce a driving voltage that is set based on the operational characteristics and configured to apply the driving voltage to the first tunable gain inverter, the second tunable gain inverter, the first fixed gain inverter, the second fixed gain inverter, the first coupling inverter, and the second coupling inverter.

7. The electrical integrated circuit of claim 1, wherein the first signal pathway includes:

a third inductor, electrically connected to a seventh node on the first signal pathway and an eighth node on the first signal pathway a third tunable gain inverter, electrically connected to the eighth node and a ninth node on the first signal pathway; and a third fixed gain inverter, electrically connected to the seventh node and the eighth node.

8. The electrical integrated circuit of claim 7, wherein a first gain of the first tunable gain inverter and a second gain of the third tunable gain inverter are set based on the operational characteristics and the second gain is greater than the first gain.

9. The electrical integrated circuit of claim 1, wherein the first signal pathway further comprises:

an electrostatic discharge protector attached between the third node and the optical modulator.

\* \* \* \* \*